US009324584B2

(12) United States Patent
Do et al.

(10) Patent No.: US 9,324,584 B2
(45) Date of Patent: Apr. 26, 2016

(54) INTEGRATED CIRCUIT PACKAGING SYSTEM WITH TRANSFERABLE TRACE LEAD FRAME

(71) Applicants: Byung Tai Do, Singapore (SG); Arnel Senosa Trasporto, Singapore (SG); Linda Pei Ee Chua, Singapore (SG)

(72) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/714,865

(22) Filed: Dec. 14, 2012

(65) Prior Publication Data
US 2014/0167236 A1    Jun. 19, 2014

(51) Int. Cl.
*H01L 21/56* (2006.01)
*H01L 23/31* (2006.01)
*H01L 23/495* (2006.01)
*H01L 23/498* (2006.01)
*H01L 21/48* (2006.01)

(52) U.S. Cl.
CPC ........... *H01L 21/56* (2013.01); *H01L 21/565* (2013.01); *H01L 23/3128* (2013.01); *H01L 23/49861* (2013.01); *H01L 21/4828* (2013.01); *H01L 21/568* (2013.01); *H01L 23/49548* (2013.01); *H01L 23/49582* (2013.01); *H01L 23/49816* (2013.01); *H01L 2224/32145* (2013.01); *H01L 2224/48091* (2013.01); *H01L 2224/73204* (2013.01); *H01L 2224/73265* (2013.01); *H01L 2924/3025* (2013.01)

(58) Field of Classification Search
CPC .......... H01L 2224/73204; H01L 2224/73265; H01L 23/49582; H01L 23/49861

USPC .................. 438/123, 111, 112; 257/E23.031, 257/666–776, E23.039, E21.499, E23.043
See application file for complete search history.

(56) References Cited

U.S. PATENT DOCUMENTS

| | | | |
|---|---|---|---|
| 5,780,926 A * | 7/1998 | Seo .................... | H01L 23/49531 257/676 |
| 6,953,988 B2 * | 10/2005 | Seo et al. ...................... | 257/666 |
| 8,106,492 B2 * | 1/2012 | Chang Chien et al. ........ | 257/676 |
| 8,120,152 B2 * | 2/2012 | Chang Chien et al. ........ | 257/676 |
| 8,237,250 B2 * | 8/2012 | Chang Chien et al. ........ | 257/676 |
| 8,492,883 B2 * | 7/2013 | Chien et al. .................... | 257/676 |
| 2009/0034225 A1 * | 2/2009 | Shoji et al. ..................... | 361/809 |
| 2009/0127682 A1 * | 5/2009 | Kim et al. ...................... | 257/676 |
| 2009/0230523 A1 * | 9/2009 | Chien et al. .................... | 257/676 |
| 2009/0230524 A1 * | 9/2009 | Chien et al. .................... | 257/676 |
| 2009/0230525 A1 * | 9/2009 | Chang Chien et al. ........ | 257/676 |
| 2009/0230526 A1 * | 9/2009 | Chen et al. ..................... | 257/676 |
| 2010/0044850 A1 * | 2/2010 | Lin et al. ........................ | 257/690 |
| 2010/0258920 A1 * | 10/2010 | Chien et al. .................... | 257/666 |
| 2010/0258921 A1 * | 10/2010 | Chang Chien et al. ........ | 257/676 |
| 2010/0258934 A1 * | 10/2010 | Chang Chien et al. ........ | 257/690 |
| 2011/0163430 A1 * | 7/2011 | Lee et al. ....................... | 257/676 |
| 2011/0169145 A1 * | 7/2011 | Maniwa et al. ................ | 257/666 |

* cited by examiner

*Primary Examiner* — Marvin Payen
*Assistant Examiner* — Victor Barzykin
(74) *Attorney, Agent, or Firm* — Ishimaru & Associates LLP

(57) ABSTRACT

System and method of manufacturing an integrated circuit packaging system using transferable trace lead frame. A lead frame is provided having lower metal contacts. A masking layer can be formed on an upper surface of the lead frame for protection and shielding purposes. Routing layer and conductive lands may subsequently be formed by shaping the lead frame, along with bottom encapsulation. The masking layer may subsequently be removed for additional processing steps including connecting an integrated circuit die to the upper surface of the lead frame.

11 Claims, 4 Drawing Sheets

INTEGRATED CIRCUIT PACKAGING SYSTEM WITH TRANSFERABLE TRACE LEAD FRAME

TECHNICAL FIELD

The present disclosure relates generally to an integrated circuit packaging system, and more particularly to system and method of manufacturing the packaging system using transferable trace lead frame.

BACKGROUND

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller and thinner as well.

Thus, there still exists a need for an integrated circuit packaging system with lead frame grid array mechanism providing low cost manufacturing, improved yields, and reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

SUMMARY

Disclosed are system and method of manufacturing an integrated circuit packaging system using transferable trace lead frame. In one embodiment, a method of manufacturing an integrated circuit packaging system includes: (a) providing a lead frame having a contact on a lower surface of the lead frame; (b) forming a masking layer over an upper surface of the lead frame; (c) forming a routing layer having a conductive land on the contact by shaping the bottom surface of the lead frame; (d) forming a bottom encapsulation on the conductive land with the contact exposed from the bottom encapsulation; (e) removing the masking layer from the upper surface of the lead frame; and (f) connecting an integrated circuit die to the upper surface of the lead frame.

In one embodiment, the method further includes: (g) forming an external interconnect on the contact. In another embodiment, the method further includes: (h) forming a top encapsulation over the integrated circuit die and the upper surface of the lead frame. In yet another embodiment, the method further includes: (i) forming an internal connector from the integrated circuit die to the at least one of the lead frame, the routing layer, and the conductive land.

In one embodiment, a method of manufacturing an integrated circuit packaging system includes: (a) providing a lead frame having a support portion, an inner portion, two metal connectors on an upper surface of the inner portion separated by the support portion, and a bottom cover on a bottom surface of the inner portion; (b) forming a masking layer over an upper surface of the lead frame; (c) forming a routing layer having a conductive land on the bottom cover by shaping the lead frame; (d) forming a bottom encapsulation directly on the conductive land with the bottom cover exposed from the bottom encapsulation; (e) removing the masking layer from the upper surface of the lead frame; and (f) connecting an integrated circuit die to the two metal connectors directly over the bottom encapsulation.

In one embodiment, the forming step (b) includes forming the masking layer over the two metal connectors, the support portion and the inner portion. In another embodiment, the forming step (c) includes shaping the lead frame by removing the support portion. In yet another embodiment, the connecting step (f) includes the two metal connectors not separated by the support portion.

In some embodiments, the method further includes: (g) forming an external interconnect on the bottom cover; and (h) forming a top encapsulation over the integrated circuit die and the upper surface of the lead frame. In other embodiments, the method further includes: (i) forming an internal connector from the integrated circuit die to the at least one of the lead frame, the routing layer, and the conductive land.

In one embodiment, an integrated circuit packaging system using transferable trace lead frame includes: a routing layer including two conductive lands formed by shaping a lead frame, each conductive land having a metal connector on an upper surface and a metal contact on a bottom surface, the conductive lands connected by a support portion removed using a masking process during the shaping of the lead frame; a bottom encapsulation on the conductive lands with the metal contacts exposed from the bottom encapsulation; and an integrated circuit die connected to the metal connectors, wherein the integrated circuit die is situated directly over the bottom encapsulation.

In one embodiment, the system further includes external interconnects formed on the metal contacts. In another embodiment, the system further includes a top encapsulation formed over the integrated circuit die and the routing layer. In yet another embodiment, the system further includes internal connectors from the integrated circuit die to the at least one of the lead frame, the routing layer, and the conductive lands.

In some embodiments, the masking process includes a masking layer deposited over the lead frame. In other embodiments, the masking layer includes a thermal-release type of film or a UV-type film.

Other variations, embodiments and features of the present disclosure will become evident from the following detailed description, drawings and claims.

DETAILED DESCRIPTION OF THE DISCLOSURE

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

Figure 1:
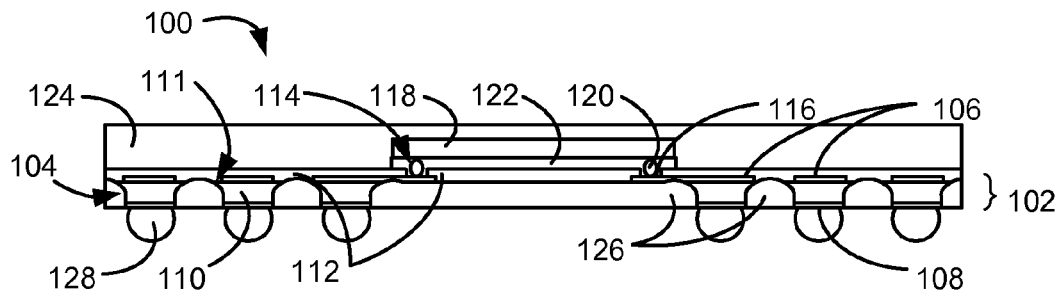
FIG. 1 is a cross-sectional view of an integrated circuit packaging system along a line 1-1 of FIG. 2 in one embodiment of the present disclosure.
Figure 2:
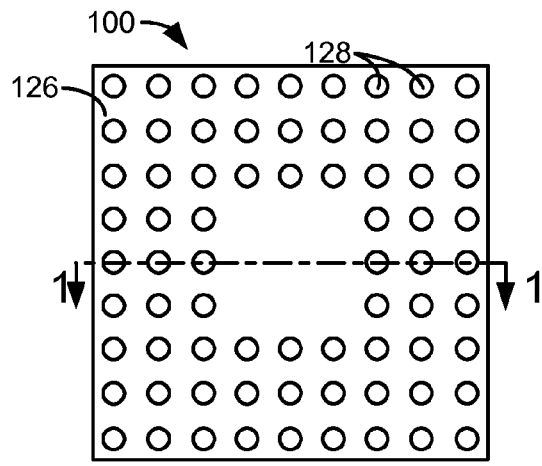
FIG. 2 is a bottom view of an integrated circuit packaging system.

FIG. 1 is a cross-sectional view of an integrated circuit packaging system 100 along a line 1-1 of FIG. 2 in one embodiment of the present disclosure. The integrated circuit packaging system 100 includes a routing layer 102.

The routing layer 102 can be a conductive structure used for routing electrical signals, power, ground, or reference potential for the integrated circuit packaging system 100. The routing layer 102 can route signals within the integrated circuit packaging system 100, between the integrated circuit packaging system 100 and external components or structures, or a combination thereof. The routing layer 102 can have a conductive land 104 and a metal connector 106.

The conductive land 104 can be a conductive portion within the routing layer 102 for routing electrical signals, power, ground or any reference potential in a non-horizontal direction. The conductive land 104 can be located on a lower portion of the integrated circuit packaging system 100. The conductive land 104 can extend in a non-horizontal direction. The conductive land 104 can have a bottom cover 108 and a column portion 110.

The bottom cover 108 can be an electrically conductive material for interfacing with components or structures external to the integrated circuit packaging system 100. The bottom cover 108 can be directly on a bottom portion of the column portion 110. The bottom cover 108 can also be used to shape and form the conductive land 104. The manufacturing process of the integrated circuit packaging system 100, including shaping and forming of the conductive land 104, will be discussed in more detail below.

The column portion 110 can be made from any number of materials. For example, the column portion 110 can be made from metal, such as copper or aluminum, or an alloy. The column portion 110 can be electrically conductive. The column portion 110 can have a non-horizontal wall connected to a top surface of the column portion 110 or an overhang portion 111 located at a top portion of the column portion 110. The non-horizontal wall and the overhang portion 111 of the column portion 110 can be joined to form an angle or a concave curve and to provide mold-locking features.

For example, the overhang portion 111 can have the top surface of the column portion 110 extending past the non-horizontal wall of the column portion. The top surface and the bottom surface of the overhang portion 111 can join and form an acute or a right angle. The bottom surface of the overhang portion 111 can extend to and be integral with the non-horizontal wall. The bottom surface of the overhang portion 111 can form an obtuse or a right angle with the non-horizontal wall. The bottom surface of the overhang portion 111 can also form a concaved curved surface with the non-horizontal wall.

The metal connector 106 can be directly on a top portion of the conductive land 104. The metal connector 106 can be conductive and extend horizontally for routing electrical signals along a horizontal plane. For example, the metal connector 106 can connect the conductive land 104, another component or structure within the integrated circuit packaging system 100, or a combination thereof. In some embodiments, the metal connector 106 can be a trace, a wire, a pad, a connector, or a combination thereof.

The integrated circuit packaging system 100 can have an insulation cover 112. The insulation cover 112 can be a non-conductive material for covering the routing layer 102. For example, the insulation cover 112 can be ceramic, solder resist, dielectric structure, or a combination thereof. The insulation cover 112 can be directly on the routing layer 102. The insulation cover 112 can selectively expose only portions of the routing layer 102 necessary for electrically connecting to other components or structures.

The insulation cover 112 can be directly on a top or side portion of the metal connector 106, a top or side portion of the conductive land 104, or a combination thereof. The insulation cover 112 can extend horizontally and over the metal connector 106, the conductive land 104, or a combination thereof. The insulation cover 112 can cover the top portion of the metal connector 106, the top portion of the conductive land 104, or a combination thereof.

The insulation cover 112 can have a connection opening 114 for selectively connecting components or structures to the metal connector 106, the conductive land 104, or a combination thereof. The connection opening 114 of the insulation cover 112 can expose the metal connector 106, the conductive land 104, or a combination thereof from the insulation cover 112. The insulation cover 112 can partially or completely cover the top portion of the metal connector 106, the top portion of the conductive land 104, or a combination thereof.

The routing layer 102 can have a connection enhancer 116, such as a solder wettable material, in the connection opening 114. The connection enhancer 116 can be on the top portion of the metal connector 106, the top portion of the conductive land 104, or a combination thereof. The connection enhancer 116 can be only on the portions of the metal connector 106, the conductive land 104, or a combination thereof exposed by the connection opening 114.

The integrated circuit packaging system 100 can have an integrated circuit die 118, such as a wire bond die or a flip chip, connected to the metal connector 106 through an internal interconnect 120, such as a bond wire or a solder bump. The integrated circuit die 118 can be attached on the insulation cover 112 and can be over the insulation cover 112, the metal connector 106, the conductive land 104, or a combination thereof. The integrated circuit die 118 can be spaced away from the insulation cover 112. The internal interconnect 120 can be in the connection opening 114 and directly on the integrated circuit die 118, the metal connector 106, the conductive land 104, or a combination thereof.

The integrated circuit packaging system 100 can have an under-fill 122, such as a capillary or a mold type. The under-fill 122 can be between, directly on, or a combination thereof for the integrated circuit die 118, the internal interconnect 120, the insulation cover 112, the metal connector 106, the conductive land 104, or a combination thereof. The under-fill 122 can also be in the connection opening 114.

The integrated circuit packaging system 100 can have a top encapsulation 124, a bottom encapsulation 126, and an external interconnect 128. The top encapsulation 124 can be over, encapsulate, be directly on, or a combination thereof for the integrated circuit die 118, the internal interconnect 120, the under-fill 122, the insulation cover 112, or a combination thereof. The bottom encapsulation 126 can be under the integrated circuit die 118.

The bottom encapsulation 126 can encapsulate and be directly on the conductive land 104 and can be between multiple instances of the conductive land 104. A bottom surface of the bottom encapsulation 126 can be coplanar with a bottom surface of the conductive land 104. The bottom surface of the bottom encapsulation 126 can also be lower than the bottom surface of the conductive land 104 and have the conductive land 104, the bottom cover 108, or a combination thereof in an indentation of the bottom encapsulation 126.

The top encapsulation 124 and the bottom encapsulation 126 can be formed separately at different times during the manufacturing process. The insulation cover 112, the metal connector 106, the conductive land 104, or a combination thereof can form a continuous horizontal plane between the top encapsulation 124 and the bottom encapsulation 126, and isolate the two-encapsulation structures.

The integrated circuit packaging system 100 can have the routing layer 102 formed from a lead frame and not a substrate structure. For example, the integrated circuit packaging system 100 can be without an inner support portion, such as such as a pre-impregnated layer in substrates, or have the routing layer 102 directly on both the insulation cover 112 and the bottom encapsulation 126.

The external interconnect 128 can be a conductive structure for electrically coupling the integrated circuit packaging system 100 to other structures, such as components or other packages. For example, the external interconnect 128 can be a solder ball, conductive posts, lands, or a combination thereof. The external interconnect 128 can be directly on the bottom portion of the conductive land 104.

In some embodiments, the insulation cover 112 can be directly on the routing layer 102 having the conductive land 104 without any inner support portions, such as the pre-impregnated layer in substrates, to provide increased versatility while improving yield and manufacturing cost. The insulation cover 112 directly on the routing layer 102 having the conductive land 104 without any inner support portions enables using lead frames having signal routing mechanisms to manufacture lead frame grid array types of packages. The insulation cover 112 further provides protection against shorts and damages to the conductive portions.

In other embodiments, the insulation cover 112 having the connection opening 114 over the routing layer 102 formed from the lead frame and not the substrate structure can provide improved yield and lower manufacturing cost. The insulation cover 112 having the connection opening 114 reduces the manufacturing complexity and material necessary to provide protection against shorts and damages to the conductive portions for lead frames. In some instances, the insulation cover 112 having the connection opening 114 only directly under the internal interconnect 120 can provide protection of the routing layer 102 while maintaining lower manufacturing cost.

In one embodiment, the conductive land 104 having the overhang portion 111 on the top portion thereof can provide improved mold lock capability for the routing layer 102 while maintaining lower manufacturing cost. The overhang portion 111 on the top portion of the conductive land 104 can be a characteristic of shaping the conductive land 104 from the bottom side only instead of from both top and the bottom. The single direction of shaping eliminates the need to separately design the shaping process from an addition direction.

FIG. 2 is a bottom view of the integrated circuit packaging system 100. The integrated circuit packaging system 100 can have the conductive land 104 of FIG. 1 and the external interconnect 128 arranged in along a straight line. The integrated circuit packaging system 100 can also have the conductive land 104 and the external interconnect 128 arranged in a shape of an oval or a rectangle, or in multiple concentric ovals or rectangles. The arrangement of the conductive land 104 and the external interconnect 128 can also be customized for the integrated circuit packaging system 100.

In one embodiment, the conductive land 104, the metal connector 106 of FIG. 1, and the insulation cover 112 of FIG. 1 can allow for increased design versatility while improving yield and manufacturing cost. The conductive land 104 and the metal connector 106 can be arranged to physically route the signals, while the insulation cover 112 can provide protection and stability to the conductive land 104 and the metal connector 106 within the integrated circuit packaging system 100.

The integrated circuit packaging system 100 can also have the bottom portion of the conductive land 104 exposed between the bottom encapsulation 126 and the external interconnect 128. The external interconnect 128, the bottom encapsulation 126, or a combination thereof can also fully cover the bottom portion of the conductive land 104.

In one embodiment, the integrated circuit packaging system 100 is a current routable lead frame grid array structure having a flip chip integrated circuit die 118, with the top encapsulation 124 protecting the flip chip integrated circuit die 118.

Figure 3:
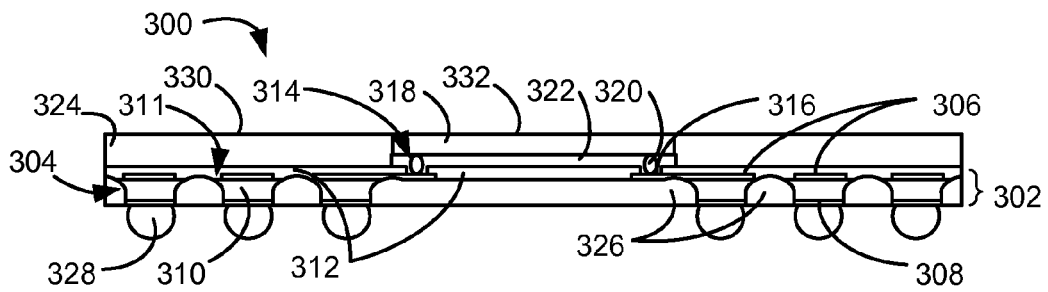
FIG. 3 is a cross-sectional view of an integrated circuit packaging system along a line 1-1 of FIG. 2 in one embodiment of the present disclosure.

FIG. 3 is a cross-sectional view of an integrated circuit packaging system 300 along a line 1-1 of FIG. 2 in one embodiment of the present disclosure. The integrated circuit packaging system 300 has many of the features similar to that of the integrated circuit packaging system 100 discussed above. For example, the integrated circuit packaging system 300 includes a routing layer 302 with conductive land 304 and metal connector 306, these components having similar material properties and characteristics as discussed above. Likewise, the conductive land 304 can have bottom cover 308 and column portion 310, with the column portion 310 having an overhang portion 311, these features also having similar properties and characteristics as discussed above. The integrated circuit packaging system 300 can include an insulation cover 312 for coverage purposes with connection opening 314 formed in similar manner as above. Like above, the routing layer 302 can include a connection enhancer 316.

In one embodiment, the integrated circuit packaging system 300 can include an integrated circuit die 318 having similar properties and formed of similar processes as disclosed above, along with under-fill 322 and internal interconnect 320. Top and bottom encapsulations 324, 326 as well as external interconnect 328 may also be included in similar fashion as described above.

In one embodiment, the integrated circuit packaging system 300 can have a top mold surface 330 of the top encapsulation 324 coplanar with a top chip surface 332 of the integrated circuit die 318. In some instances, having the top mold surface 330 of the top encapsulation 324 coplanar with the top chip surface 332 of the integrated circuit die 318 can provide lower profile height while maintaining structural integrity for the integrated circuit packaging system 300.

In some embodiments, while the integrated circuit packaging system 300 includes a grid array structure with a flip chip integrated circuit die 318, the top encapsulation 324 protects the flip chip integrated circuit die 318 and exposes an upper portion of the integrated circuit die 318 to accommodate additional integrated circuit dies or other processing and packaging steps.

Figure 4:
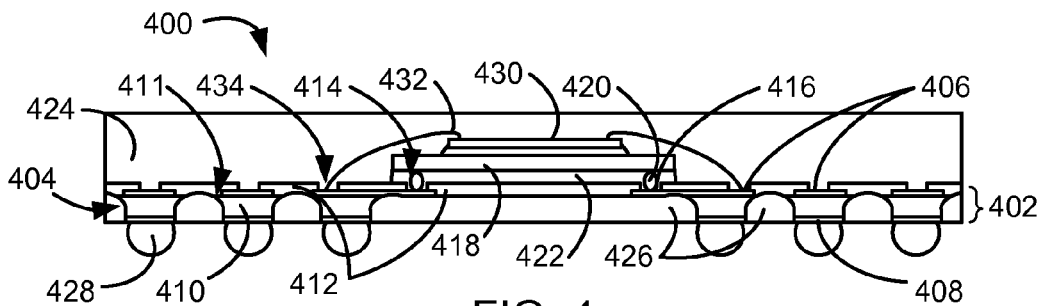
FIG. 4 is a cross-sectional view of an integrated circuit packaging system along a line 1-1 of FIG. 2 in one embodiment of the present disclosure.

FIG. 4 is a cross-sectional view of an integrated circuit packaging system 400 along a line 1-1 of FIG. 2 in one embodiment of the present disclosure. Like above, the integrated circuit packaging system 400 include many of the features similar to those above. For example, the integrated circuit packaging system 400 includes a routing layer 402 with conductive land 404 and metal connector 406, these components having similar material properties and characteristics as discussed above. Likewise, the conductive land 404 can have bottom cover 408 and column portion 410, with the column portion 410 having an overhang portion 411, these features also having similar properties and characteristics as discussed above. The integrated circuit packaging system 400 can include an insulation cover 412 for coverage purposes with connection opening 414 formed in similar manner as above. Like above, the routing layer 402 can include a connection enhancer 416.

In one embodiment, the integrated circuit packaging system 400 can include an integrated circuit die 418 having similar properties and formed of similar processes as disclosed above, along with under-fill 422 and internal interconnect 420. Top and bottom encapsulations 424, 426 as well as external interconnect 428 may also be included in similar fashion as described above.

In one embodiment, the integrated circuit packaging system 400 can have a further die 430, such as a wire bond die or a flip chip, and a further internal connector 432, such as a bond wire or a conductive post. The further die 430 can be mounted on the integrated circuit die 418. The further die 430 can have horizontal dimensions that are smaller or greater than those of the integrated circuit die 418. The further die 430 can be mounted centered with or off-center from the integrated circuit die 418. A portion of the further die 430 can extend past a periphery edge of the integrated circuit die 418 to create a die overhang portion.

The further internal connector 432 can be directly on the further die 430, the integrated circuit die 418, and the metal connector 406, the conductive land 404 or a combination thereof. The further internal connector 432 can be connected to the routing layer 402 through the connection opening 414, a further opening 434, or a combination thereof of the insulation cover 412. The further opening 434 can be similar to the connection opening 414 and expose the routing layer 402 from the insulation cover 412. The further internal connector 432 can be used to relay electrical signals to and from the further die 430.

In some embodiments, the routing layer 402 having the conductive land 404 and the metal connector 406 and the insulation cover 412 having the connection opening 414 provide improved yield in manufacturing lead frame grid array type of packages having multiple integrated circuit devices. The combination of the conductive land 404 and the metal connector 406 provide flexibility in locating connection points and routing schemes for signals to multiple devices. The insulation cover 412 having the connection opening 414 prevents shorts and protects connection portions within the package and during manufacturing.

The manufacturing processes for forming the integrated circuit packaging systems 100, 300, 400, specifically, the shaping and forming of the conductive lands 104, 304, 404, are discussed in more detail below.

Figure 5:
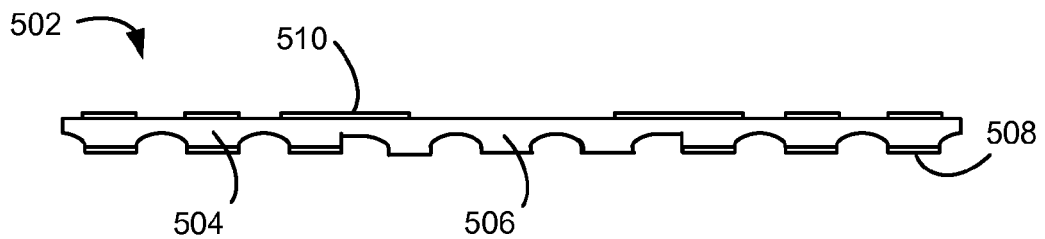
FIG. 5 is a cross-sectional view of a lead frame for manufacturing an integrated circuit packaging system according to one embodiment of the present disclosure.

FIG. 5 is a cross-sectional view of a lead frame 502 for manufacturing an integrated circuit packaging system similar to those discussed above. In one embodiment, the lead frame 502 can be a conductive structure that provides support for various components of the integrated circuit packaging system 100, 300, 400 during the manufacturing process. For example, the lead frame 502 can be a pre-plated frame having an initial shape. In the alternative, the lead frame 502 can be a standard trace lead frame 502.

The lead frame 502 can include an inner portion 504 and a support portion 506. The inner portion 504 may be separated by the central support portion 506. Portions of the lower or bottom surface of the inner portion 504 may include bottom covers or contacts 508. In other words, portions of the lower surface of the lead frame 502 may include bottom covers or contacts 508. A portion of the inner portion 504 directly on the bottom cover 508 can be designated for forming a conductive land 714, which will become more apparent in subsequent processing steps.

The support portion 506 may be without bottom covers or contacts 508. In some instances, the support portion 506 may be shaped as shown having concaving features and/or recesses. In other instances, the support portion 506 may be substantially flat or planar (not shown).

The inner portion 504 can be initially shaped, such as through a chemical etching or metal forming process. The inner portion 504 can be shaped to separate the portion of the lead frame 502 designated for forming the conductive land 714. In some embodiments, the lead frame 502 can be further shaped to complete the formation of the conductive land 714 as discussed below.

The inner portion 504 can have a planar bottom surface without the initial shaping process. The lead frame 502 can have the bottom cover or contact 508 directly on the planar bottom surface of the inner portion 504. In some instances, the further shaping process can form the conductive land 714 without the initial shaping process.

The lead frame 502 can also have a support portion 506. The support portion 506 can be the portion of the lead frame 502 located horizontally between instances of the bottom cover 508 for providing rigidity to the lead frame 502 during the manufacturing process. The support portion 506 can be below a portion intended for supporting an integrated circuit die 118, 318, 418. The support portion 506 can be absent the bottom cover 508 and can be removed during the further shaping process described below. In some instances, lead frame 502 having the support portion 506 can have minimized bowing damage during manufacturing and provide improved yield.

The lead frame 502 can have a planar surface or a concave surface horizontally between instances of the bottom cover 508. The lead frame 502 can have the planar or the concave surfaces only between the instances of the bottom cover 508 without the support portion 506.

The lead frame 502 can have metal connectors 510. The metal connector 510 can be formed on a top surface of the inner portion 504. The metal connector 510 can be patterned according to a design for routing the signals along a horizontal plane. In some embodiments, two or more metal connectors 510 may be formed on an upper surface of the inner portion 504 of the lead frame 502.

Figure 6:
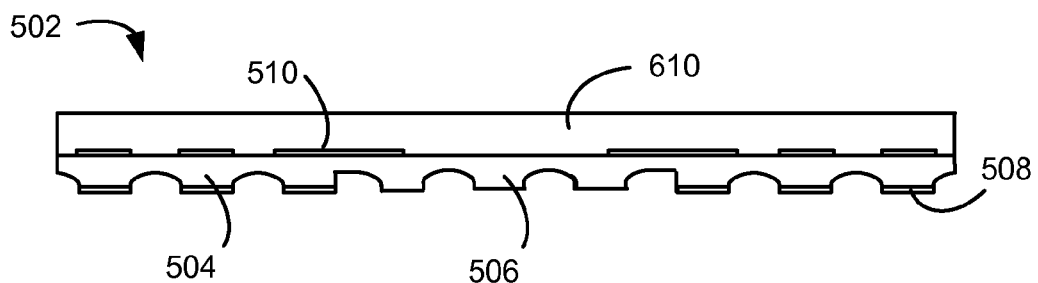
FIG. 6 is the structure of FIG. 5 with a masking layer.

FIG. 6 is a cross-sectional view of the structure of FIG. 5 with the addition of a masking layer 610 formed thereon. The masking layer 610 may be formed through a deposition process on an upper surface of the lead frame 502. In the alternative, the masking layer 610 can be formed via lamination or printing process, among other suitable methods. In some embodiments, the masking layer 610 may be a thermal-release type of film or an UV-type film. The masking layer 610 may be formed over and on the metal connectors 510, the support portion 506, and the inner portion 504, or a combination thereof, to protect or shield the upper surface of the lead frame 502 from subsequent processing steps. In some instances, the masking layer 610 can be formed directly over or completely cover portions of the metal connectors 510, the support portion 506, and the inner portion 504, or a combination thereof. In other embodiments, the masking layer 610 may be any suitable material that may be used as a sacrificial transfer material for the preservation of the lead frame 502.

Figure 7:
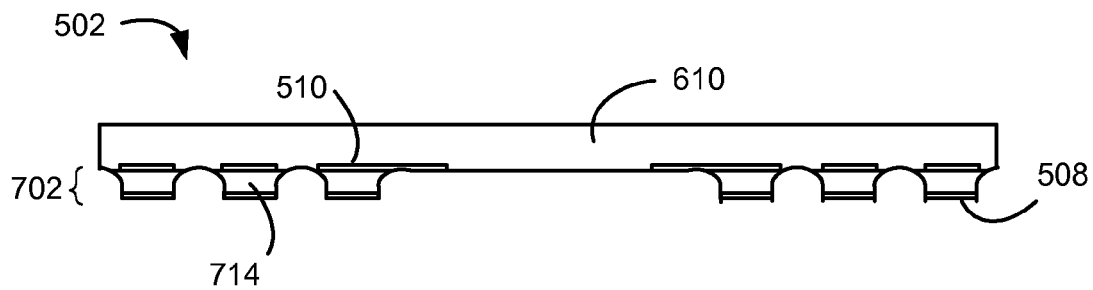
FIG. 7 is the structure of FIG. 6 with a conductive land.

FIG. 7 is a cross-sectional view of the structure of FIG. 6 with a conductive land 714 formed thereon. In other words, the lead frame 502 of FIG. 6 can be further shaped to form the conductive land 714. In one embodiment, the bottom cover or contact 508 can be used as a mask for the shaping process.

For example, an etching process or a metal shaping process can remove portions of the inner portion 504 of FIG. 6 horizontally between instances of the contacts or bottom cover 508. The portions of the lead frame 502 not having the contacts or bottom cover 508 can be removed. For example, the support portion 506 of FIG. 6, other portions horizontally between the bottom cover 508, or a combination thereof can be removed during the shaping process. In this example, the material removed or etched may be un-plated copper layer thus forming the individual pad or conductive land 714.

In one embodiment, an etching process during the formation of the conductive land 714 may remove the support portion 506 of the lead frame 502. In some embodiments, the etching process may remove materials between the inner portions 504 of the lead frame 502. Additional removal may be prevented or minimized by the material properties of the masking layer 610.

The removal process of parts of the lead frame 502 allows for the formation of a routing layer 702 similar to those discussed above where the routing layer 702 includes a conductive land 714 and contacts or bottom covers 508. In some embodiments, the routing layer 702 can be formed by shaping the bottom surface of the lead frame 502.

Figure 8:
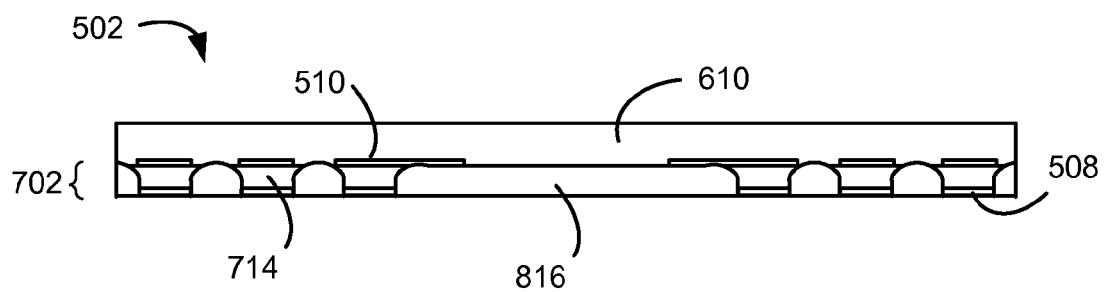
FIG. 8 is the structure of FIG. 7 with a bottom encapsulation.

FIG. 8 is a cross-sectional view of the structure of FIG. 7 with the bottom encapsulation 816 formed thereon. The bottom encapsulation 816 can be formed around the routing layer 702, the conductive land 714, portions of the lower surface of the lead frame 502, or a combination thereof. In operation, the bottom encapsulation 816 may be formed by a coating or printing process, among other suitable processes.

In some instances, the bottom encapsulation 816 can be formed directly on the routing layer 702, the conductive land 714, or a combination thereof, with the contact or bottom cover 508 exposed from the bottom encapsulation 816. The bottom encapsulation 816 may protect or shield the features about the bottom surface of the lead frame 502. For example, the bottom encapsulation 816 may protect the routing layer 702, the conductive land 714, and the contact or bottom cover 508, or combination thereof. The bottom encapsulation 816 may provide further structural stability to the lead frame 502.

A bottom surface of the bottom encapsulation 816 can be coplanar with a bottom surface of the bottom cover 508. The bottom surface of the bottom encapsulation 816 can also be below the bottom surface of the bottom cover 508.

Figure 9:
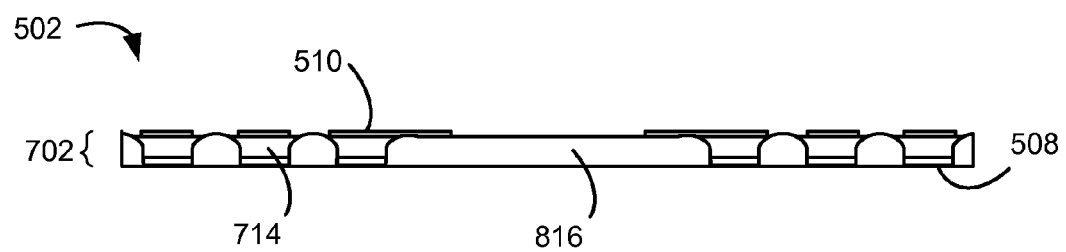
FIG. 9 is the structure of FIG. 8 without the masking layer.

FIG. 9 is a cross-sectional view of the structure of FIG. 8 with the masking layer 610 removed therefrom. In this instance, the masking layer 610 can be removed from the upper surface of the lead frame 502. The masking layer 610 layer can be chemically or mechanically removed. The masking layer 610 can also be removed by peeling to provide a relatively undamaged and pristine upper surface of the lead frame 502 for additional processing steps such as, for example, a die attach process. The pristine upper surface of the lead frame 502, preserved by the masking layer 610, is thereby able to deliver the desired quality trace conditions.

In some instances, the lead frame 502 may be subjected to high temperature processing as necessary for the removal of the masking layer 610. For example, the lead frame 502 may be subjected to elevated heat in combination with a UV cure process to help in the removal of the masking layer 610. The lead frame 502 may also be subjected to other processes as necessary to facilitate in the removal of the masking layer 610.

Figure 10:
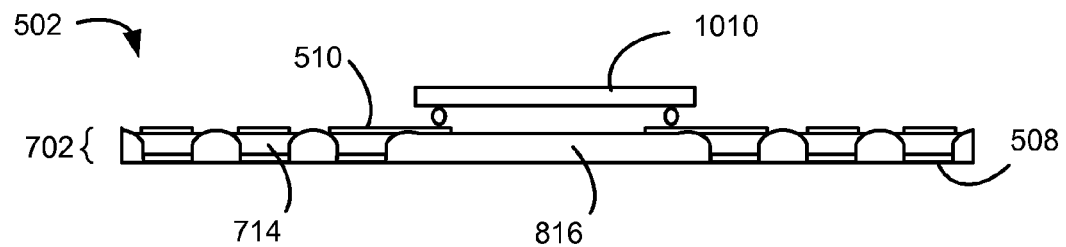
FIG. 10 is the structure of FIG. 9 with an integrated circuit die.

FIG. 10 is a cross-sectional view of the structure of FIG. 9 with an integrated circuit die 1010 connected thereon. The integrated circuit die 1010 can be connected to an upper surface of the lead frame 502. The integrated circuit die 1010 can be connectedly attached to the lead frame 502 directly over and overlapping the bottom encapsulation 816. The integrated circuit die 1010 can be directly coupled to the lead frame 502. In one embodiment, the integrated circuit die 1010 can be connected to the metal connectors 510 and directly over the bottom encapsulation 816 without any support portion 506 underneath. In this instance, the metal connectors 510 are no longer separated by the support portion 506 but instead are separated by the bottom encapsulation 816.

The structure of FIG. 10 may subsequently undergo additional processing steps to form the integrated circuit packaging system 100, 300, 400 similar to those discussed above. For example, the integrated circuit die 1010 of FIG. 10 may be attached to the lead frame 502 in a manner similar to that of a flip-chip package. Subsequent processing steps including molding, encapsulation, wire bonding, flip-chip attachment, solder ball attachment, and singulation, among other processing steps, may be implemented to produce the integrated circuit packaging system 100, 300, 400 as disclosed above.

In some embodiments, external interconnects 128, 328, 428 may be formed on the contact or bottom cover 508 of the lead frame 502 of FIG. 10. The external interconnects 128, 328, 438 may have similar properties and be formed in similar manners as described above.

In other embodiments, a top encapsulation 124, 324, 424 may be formed over the integrated circuit die 1010 and the upper surface of the lead frame 502 of FIG. 10. The top encapsulation 124, 324, 424 may have similar properties and be formed in similar manners as described above.

In yet another embodiment, internal connectors 432 may be formed from the integrated circuit die 1010 of the lead frame 502 of FIG. 10 to the at least one of the lead frame 502, the routing layer 702, and the conductive land 714. Specifically, the internal connectors 432 may be formed on the at least one of the upper surfaces of the lead frame 502, the routing layer 702 (e.g., the metal connectors 510), and the conductive land 714. The internal connectors 432 may have similar properties and be formed in similar manners as described above.

Figure 11:
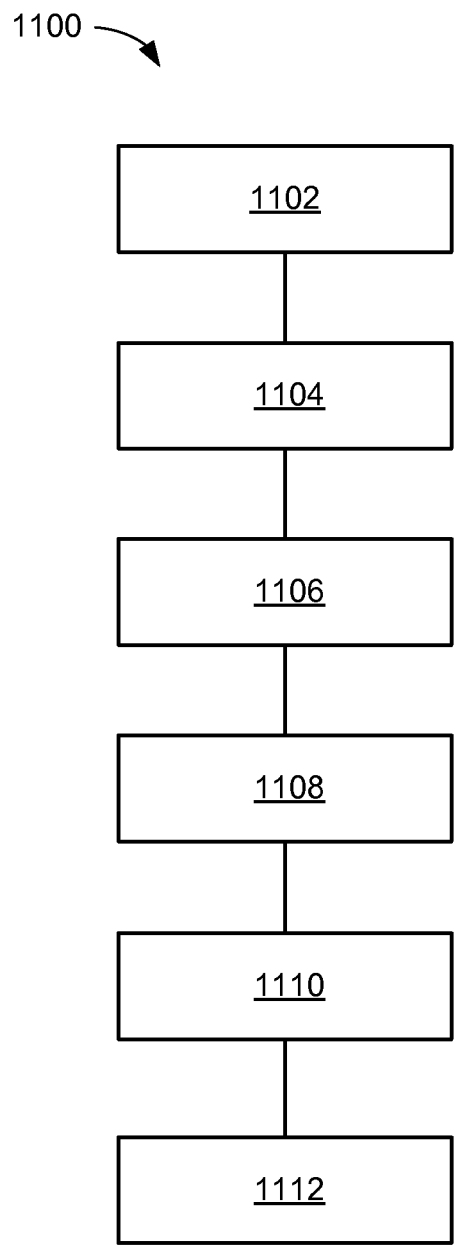
FIG. 11 is a flow chart of a method of manufacturing an integrated circuit packaging system according to one embodiment of the present disclosure.

FIG. 11 is a flow chart of a method 1100 of manufacturing an integrated circuit packaging system 100, 300, 400 according to one embodiment of the present disclosure.

In some embodiments, the method 1100 includes: step (a) 1102 of providing a lead frame 502 having a contact 508 on a lower surface of the lead frame 502; step (b) 1104 of forming a masking layer 610 over an upper surface of the lead frame 502; step (c) 1106 of forming a routing layer 702 having a conductive land 714 on the contact 508 by shaping the bottom surface of the lead frame 502; step (d) 1108 of forming a bottom encapsulation 816 on the conductive land 714 with the contact 508 exposed from the bottom encapsulation 816; step (e) 1110 of removing the masking layer 610 from the upper surface of the lead frame 502; and step (f) 1112 of connecting an integrated circuit die 1010 to the upper surface of the lead frame 502.

In one embodiment, the method 1100 further includes step (g) of forming an external interconnect 128, 328, 428 on the contact 508. In another embodiment, the method 1100 further includes step (h) of forming a top encapsulation 124, 324, 424 over the integrated circuit die 1010 and the upper surface of the lead frame 502. In yet another embodiment, the method 1100 further includes step (i) of forming an internal connector 432 from the integrated circuit die 1010 to the at least one of the lead frame 502, the routing layer 702, and the conductive land 714.

In other embodiments, the method 1100 includes: step (a) 1102 of providing a lead frame 502 having a support portion 506, an inner portion 504, two metal connectors 510 on an upper surface of the inner portion 504 separated by the support portion 506, and a bottom cover 508 on a bottom surface of the inner portion 504; step (b) 1104 of forming a masking layer 610 over an upper surface of the lead frame 502; step (c) 1106 of forming a routing layer 702 having a conductive land 714 on the bottom cover 508 by shaping the lead frame 502; step (d) 1108 of forming a bottom encapsulation 816 directly on the conductive land 714 with the bottom cover 508 exposed from the bottom encapsulation 816; step (e) 1110 of removing the masking layer 610 from the upper surface of the lead frame 502; and step (f) 1112 of connecting an integrated circuit die 1010 to the two metal connectors 510 directly over the bottom encapsulation 816.

In one embodiment, step (b) 1104 of forming the masking layer 610 includes forming the masking layer 610 over the two metal connectors 510, the support portion 506 and the inner portion 504 of the lead frame 502. In another embodiment, step (c) 1106 of forming the routing layer 702 includes shaping the lead frame 502 by removing the support portion 506. In yet another embodiment, step (f) 1112 of connecting the integrated circuit die 1010 includes connecting the integrated circuit die 1010 to the two metal connectors 510 where the two metal connectors 510 are not separated by the support portion 506.

In some embodiments, the method 1100 further includes step (g) of forming an external interconnect 128, 328, 428 on the bottom cover 508 and step (h) of forming a top encapsulation 124, 324, 424 over the integrated circuit die 1010 and the upper surface of the lead frame 502. In other embodiments, the method 1100 further includes step (i) of forming an interconnector 432 from the integrated circuit die 1010 to the at least one of the lead frame 502, the routing layer 702, and the conductive land 714.

Although several manufacturing processes of the integrated circuit packaging systems 100, 300, 400 are disclose herein, additional manufacturing processes similar to those disclosed in US Patent Application No. 2012/0280390, filed May 5, 2011 and published Nov. 8, 2012, which is incorporated herein by reference, may also be utilized.

Although the current description has been described in detail with reference to several embodiments, additional variations and modifications exist within the scope and spirit of the disclosure.

What is claimed is:

1. A method comprising:
   (a) providing a lead frame having a contact on a lower surface of the lead frame and metal connectors on an upper surface of the lead frame;
   (b) forming a masking layer over the upper surface of the lead frame and the metal connectors;
   (c) forming a routing layer having a conductive land on the contact by shaping the bottom surface of the lead frame;
   (d) forming a bottom encapsulation on the conductive land and the contact thereon with the contact exposed from the bottom encapsulation;
   (e) removing the masking layer from the upper surface of the lead frame;
   (f) forming an insulation cover directly on a portion of the metal connectors, the insulation cover is on a top portion of the metal connector, a side portion of the metal connector, and a top portion of the conductive land;
   (g) connecting an integrated circuit die to the upper surface of the lead frame, the integrated circuit die spaced away from the insulation cover; and
   (h) applying an underfill on the integrated circuit die and in a connection opening of the insulation cover.

2. The method of claim 1, further comprising:
   (i) forming an external interconnect on the contact.

3. The method of claim 2, further comprising:
   (j) forming a top encapsulation over the integrated circuit die and the upper surface of the lead frame.

4. The method of claim 3, further comprising:
   (k) forming an internal connector from the integrated circuit die to the at least one of the lead frame, the routing layer, and the conductive land.

5. The method of claim 1 wherein the masking layer includes a thermal-release type of film or a UV-type film.

6. A method comprising:
   (a) providing a lead frame having a support portion, an inner portion, a metal connector on an upper surface of the inner portion, the metal connector is separated from another metal connector by the support portion, and a contact is on a bottom surface of the inner portion;
   (b) forming a masking layer over an upper surface of the lead frame and the metal connectors;
   (c) forming a routing layer having a conductive land on the contact by shaping the lead frame;
   (d) forming a bottom encapsulation directly on the conductive land and the contact thereon with the contact exposed from the bottom encapsulation;
   (e) removing the masking layer from the upper surface of the lead frame;
   (f) forming an insulation cover directly on a portion of the metal connector, the insulation cover is on a top portion of the metal connector, a side portion of the metal connector, and a top portion of the conductive land; and
   (g) connecting an integrated circuit die to the metal connector directly over the bottom encapsulation, the integrated circuit die spaced away from the insulation cover; and
   (h) applying an underfill on the into rated circuit die and in a connection opening of the insulation cover.

7. The method of claim 6, wherein the forming step (b) includes forming the masking layer over the metal connector, the support portion, and the inner portion.

8. The method of claim 6, wherein the forming step (c) includes shaping the lead frame by removing the support portion.

9. The method of claim 6, wherein the connecting step (g) includes the metal connector separated from another metal connector by the bottom encapsulation.

10. The method of claim 6, further comprising:
    (i) forming an external interconnect on the contact; and
    (j) forming a top encapsulation over the integrated circuit die and the upper surface of the lead frame.

11. The method of claim 10, further comprising:
    (k) forming an internal connector from the integrated circuit die to the at least one of the lead frame, the routing layer, and the conductive land.

\* \* \* \* \*